US011139026B2

United States Patent
Islam (10) Patent No.: US 11,139,026 B2
(45) Date of Patent: Oct. 5, 2021

(54) VARIABLE REFERENCE BASED SENSING SCHEME

(71) Applicant: Intel Corporation, Santa Clara, CA (US)

(72) Inventor: Ashraf B. Islam, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 66 days.

(21) Appl. No.: 16/782,321

(22) Filed: Feb. 5, 2020

(65) Prior Publication Data

US 2021/0241829 A1   Aug. 5, 2021

(51) Int. Cl.
   *G11C 13/00*   (2006.01)
   *G06F 3/06*   (2006.01)

(52) U.S. Cl.
   CPC .......... *G11C 13/004* (2013.01); *G06F 3/0626* (2013.01); *G06F 3/0659* (2013.01); *G06F 3/0679* (2013.01); *G11C 13/003* (2013.01); *G11C 13/0004* (2013.01); *G11C 2013/0045* (2013.01)

(58) Field of Classification Search
   CPC .................................................... G11C 13/004
   See application file for complete search history.

(56) References Cited

U.S. PATENT DOCUMENTS

| | | | | |
|---|---|---|---|---|
| 2009/0287975 | A1* | 11/2009 | Kim | G11C 11/5628 714/746 |
| 2010/0124125 | A1* | 5/2010 | Amanai | G11C 16/28 365/185.21 |
| 2014/0192588 | A1* | 7/2014 | Lee | G11C 13/004 365/148 |
| 2015/0243352 | A1* | 8/2015 | Park | G11C 11/5642 365/163 |
| 2019/0088299 | A1* | 3/2019 | Antonyan | H01L 27/228 |

\* cited by examiner

*Primary Examiner* — Douglas King
(74) *Attorney, Agent, or Firm* — Compass IP Law, PC (57) ABSTRACT

A variable reference based sensing scheme is described. In one example, performance of a memory command to access a crosspoint memory device such as a memory read or memory write command involves a sensing operation. In one example, a memory read operation involves applying a voltage across the memory cell and sensing current through the cell. The current through the memory cell is compared with one of multiple reference currents to determine the state of the memory cell. The reference current is selected based on the voltage applied across the memory for the sensing operation. Different reference currents may be used for different types of operations. For example, different reference currents may be selected for a write sensing operation than for a read sensing operation.

20 Claims, 9 Drawing Sheets

VARIABLE REFERENCE BASED SENSING SCHEME

FIELD

The descriptions are generally related to memory, and more particularly, to sensing techniques using variable reference currents for nonvolatile memory, such as crosspoint memory.

BACKGROUND

Memory resources have innumerable applications in electronic devices and other computing environments. There is demand for memory technologies that can scale smaller than traditional memory devices. However, continued drive to smaller and more energy efficient devices has resulted in scaling issues with traditional memory devices. Three-dimensional memory devices emerged as a solution to the scaling limitations of traditional memory devices.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing at least one implementation of the invention that includes one or more particular features, structures, or characteristics. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein.

DETAILED DESCRIPTION

Variable reference based sensing techniques for crosspoint memory are described herein.

Crosspoint memory can be written to and read from by applying particular voltages across crosspoint memory cells. One example of a read operation involves applying a voltage across the cell and detecting current through the cell in response to the applied voltage. The magnitude of current through the cell in response to the applied voltage depends on the state of the memory cell. For example, consider a single level (SLC) crosspoint memory cell that can be in one of two states: "set" (e.g., logic 0) or "reset" (e.g., logic 1). If the current through the cell is less than a reference current, the cell is determined to be in a "set" (e.g., logic 0) state. If the current through the cell is greater than the reference current, the cell is determined to be in a "reset" (e.g., logic 1) state.

Typically, a static reference current is used to determine the state of the cell. However, the current distributions for set and reset cells can vary based on the magnitude of the applied voltage. Therefore, use of a static reference current for different voltages can reduce or eliminate the "sense window" or separation between the current distributions. Thus, use of a static reference current reduces the flexibility of voltage placement, which in turn increases the bit error rate.

In contrast, adjusting the reference current based on the voltage used for sense operations can maximize the sense window and decrease error rate.

Figure 1A:
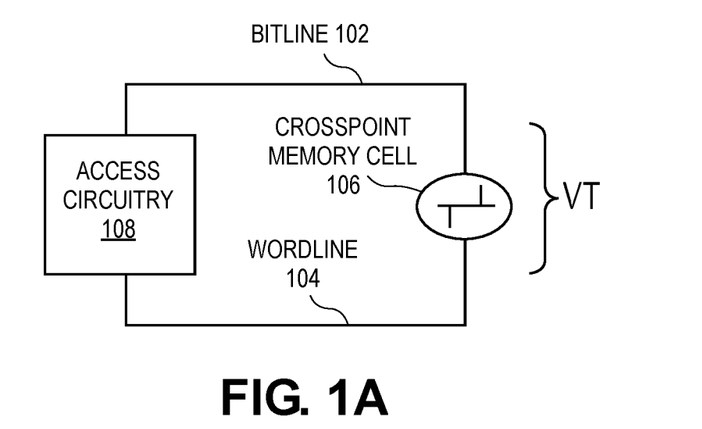
FIG. 1A is circuit diagram of an example of a two-terminal crosspoint memory cell for which the variable reference based sensing technique can be implemented.

FIG. 1A is circuit diagram of an example of a two-terminal crosspoint memory cell for which the variable reference based sensing technique can be implemented. The crosspoint memory cell is one of many memory cells in a crosspoint memory device. The crosspoint memory cell 106 is coupled with access circuitry via a bitline 102 and a wordline 104. The crosspoint memory cell 106 includes a material to store one or more bits. The memory element of the crosspoint memory cell 106 can include any memory element that can be programmed to two or more stable states. In one example, the cell 106 can be in one of multiple (e.g., 2, 4 or more) resistive states. In one such example, each different resistive state is associated with a different threshold voltage (VT). A threshold voltage is a voltage at which the cell 106 undergoes a change (e.g., a physical change) that causes the cell to be in a higher conductive state. In one example, a memory cell can be said to "threshold" or undergo a "threshold event." In one example, when a memory cell thresholds (e.g., in response to an applied voltage with a magnitude greater than the threshold voltage at the current state), the memory cell undergoes a physical change that causes the memory cell to exhibit certain electrical characteristics, such as high conductivity. Once a cell thresholds, a program current of a particular amplitude, polarity, and duration can be applied to the cell to cause the cell to be in the desired resistive state. The value stored by the crosspoint memory cell 106 can therefore be determined by detecting the resistive state of the cell, which can be determined by detecting the current that flows through the cell in response to an applied voltage.

The memory cell 106 is coupled with circuitry 108 to enable access to and operation of the memory cell 106. The circuitry includes electronic components that are electrically coupled to perform one or more of: supplying voltages to the memory cell, sensing electrical responses of the memory cell, performing analog or logic operations on received or stored information, outputting information, and storing information. In one example, the access circuitry 108 includes circuitry to select memory cells, write to memory cells, and read from memory cells.

Figure 1B:
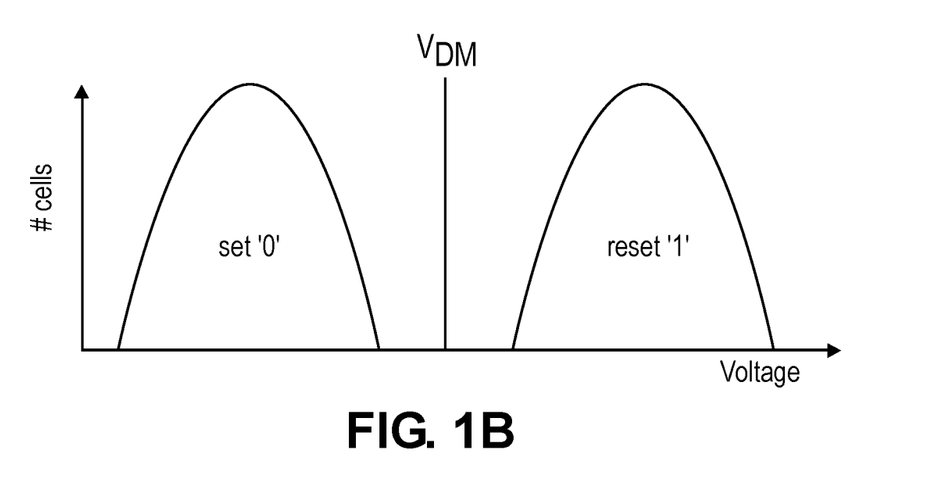
FIG. 1B illustrates an example of threshold voltage distributions of a single level cell (SLC) crosspoint memory cell.

FIG. 1B illustrates an example of threshold voltage distributions of a single level cell (SLC) crosspoint memory cell. FIG. 1B shows an example of a distribution of threshold voltages for a set cell and for a reset cell. In the illustrated example, a set cell is associated with a "logic 0" and a reset cell is associated with a "logic 1," however, the encoding scheme may be different. For example, a logic 0 may be associated with a higher magnitude threshold voltage distribution than logic 1.

A voltage for reading the memory cells is placed between the threshold voltage distributions or set and reset cells. For ease of reference, the voltage is referred to in the following description as a "demarcation voltage" (VDM); however, the voltage for a sense operation may be referred to as a "read voltage," "sense voltage," "reference voltage," or simply "a voltage."

Figure 1C:
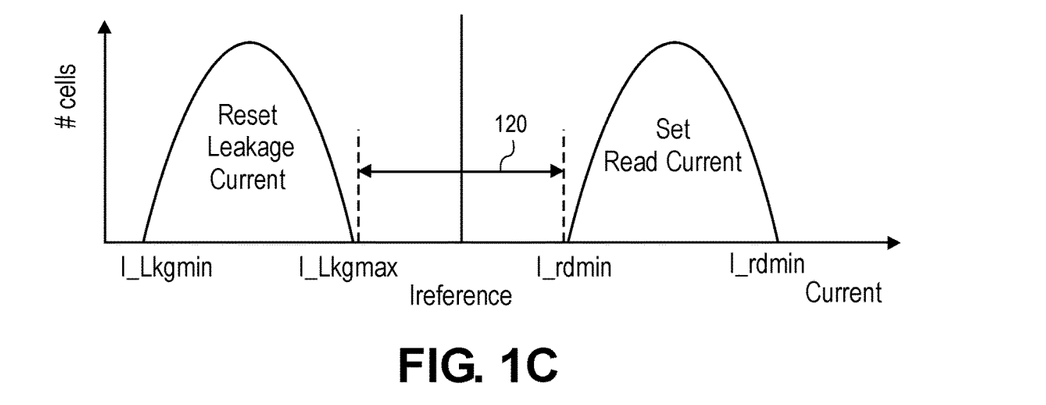
FIG. 1C illustrates an example of cell current distributions for a read operation and sense current reference placement.

As mentioned briefly above, the crosspoint memory cells conduct current in response to voltage applied across the cells. FIG. 1C illustrates an example of cell current distributions for a read operation and sense current reference placement. FIG. 1C illustrates two current distributions in response to application of a demarcation voltage for a read operation. When a demarcation voltage is applied across a reset cell, a leakage current flows through the memory cell. In one example, the leakage current is an exponential function of the applied voltage (e.g., the demarcation voltage), among other factors. Therefore, the higher the applied voltage, the higher the leakage current. The relationship between leakage current and demarcation voltage can be given by the following equation, where K and a are fitting parameters.

$$I_{leakage} = K \times e^{\alpha(VDM)} \quad \text{(Equation 1)}$$

The leakage current has a distribution with a minimum leakage current I_lkgmin and a maximum leakage current I_lkgmax. The leakage current distribution is due to various factors such as temperature, background data patterns, the threshold voltage (Vt) distribution of the cell, and Vt drift of the cell.

The demarcation voltage applied for performing a sense operation may be adjusted due to threshold voltage movement of the memory cell. For example, a higher or lower magnitude demarcation voltage may be applied due to anticipated threshold voltage drift. If a higher magnitude demarcation voltage is applied, then the magnitude of the leakage current also increases. In the example of FIG. 1C, the maximum leakage current (I_lkgmax) dictates the maximum demarcation voltage.

When the demarcation voltage is applied across a set cell, then a higher "read" current flows through the cell. The read current is a function of resistance and applied demarcation voltage in the path (e.g., across the memory cell), and can be represented by the following equation (Ohm's law):

$$I_{readset} = VDM/R_{path} \quad \text{(Equation 2)}$$

In a typical design there is a current mirror in the path to control the current; However, when the actual current flowing through the memory cell is lower than the mirror current due to path resistance, then the current is governed by the equation 2 above rather than the current mirror.

As can be seen from equations 1 and 2, both the leakage current and read current are a function of the applied voltage across the memory cell. Reset cells conduct a leakage current that is relatively small in magnitude in response to the demarcation voltage. Set cells conduct current ("read current") that is larger in magnitude than the reset cells in response to the demarcation voltage. Therefore, in the example illustrated in FIG. 1C, there is a separation or window 120 between the current distributions for set and reset cells. In conventional crosspoint memory, a static reference current (Ireference) is selected to fall between the reset current distribution and the set current distribution. For example, for a sensing operation, the reference current (Ireference) is placed in between the maximum leakage current and the minimum read current.

The actual current through the cell in response to the demarcation voltage is compared to the selected reference current to determine the state, and thus logic value stored by the cell. In one example, the sensing is performed by converting the current difference to logic level '1' or '0'. Thus, based on whether the actual current through the cell is less than or greater than the reference current, the logic value stored by the cell can be determined. In the example illustrated in FIG. 1C, if the actual current through the cell is less than the reference current, the cell is determined to be in a reset state. If the actual current through the cell is greater than the reference current, the cell is determined to be in a set state. This sensing scheme can be performed by comparing the reference current (which is placed in between two current levels) and using an analog current comparator as a sense amplifier to convert the analog signal to logic signal.

As mentioned above, conventional sensing operations rely on a static reference current placed in the window between the current distributions. If the static reference current is placed correctly, then the sense amplifier will resolve the digital data to the correct output. However, use of a static reference current in a design in which the demarcation voltage is adjusted results in a smaller window in which I_rdmin>Ireference>I_lkgmax. The smaller window poses a restriction on the maximum leakage current, which in turn causes a restriction on the maximum demarcation voltage. This approach can also pose a restriction on the minimum read current, which may not be optimal for yield. Thus, the overall sense current window (I_rdmin−I_lkgmax) gets smaller, which may result in operation of the device in a suboptimal region that shows up as yield loss.

Figure 1D:
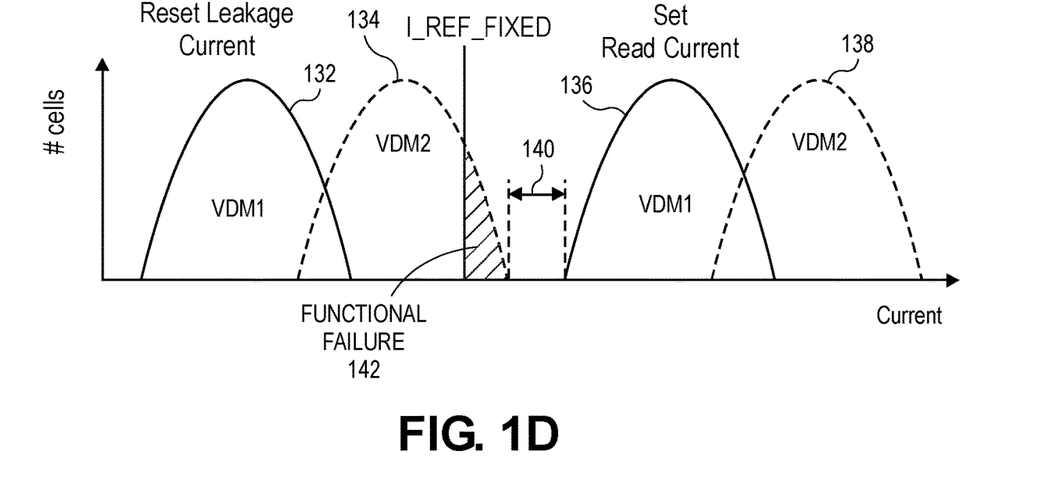
FIG. 1D illustrates examples of fixed reference current schemes.

FIG. 1D shows examples of fixed reference current schemes. FIG. 1D depicts four current distributions. The current distributions 132 and 134 correspond to two different demarcation voltages (VDM1 and VDM2) applied across reset cells. The current distributions 136 and 138 correspond to the two different demarcation voltages applied across set cells. As mentioned above, the magnitude of the leakage and read current increases in response to an increase in the applied demarcation voltage. Thus, application of a higher demarcation voltage (VDM2) causes the current distributions to shift higher for both reset and set cells.

In the illustrated example, the fixed reference I_REF_FIXED does not move with VDM. Thus, when using a fixed reference current, the window 140 between current distributions begins to shrink as different demarcation voltages are applied. In the example illustrated in FIG. 1D, the window 140 is defined by the minimum read current in response to VDM1 and the maximum leakage current in response to VDM2. The shrinking window may result in bit errors when the fixed reference current fails to fall in the actual window between current distributions. FIG. 1D shows an example of a functional failure resulting from the static reference current I_REF_FIXED being placed at a level that overlaps with the leakage current distribution 134 in response to application of VDM2. Thus, in the illustrated example, the reset cells exhibiting leakage current in the region 142 of the distribution 134 will actually be determined to be set cells in response to VDM2. Thus, the fixed reference current scheme can create functional failure when the leakage current is too high due to a higher VDM for some of the cells, resulting in a higher bit error rate.

In contrast, a sense reference current that tracks the demarcation voltage can prevent or minimize shrinkage of the window between current distributions and therefore eliminate restrictions that may lead to suboptimal performance or yield loss.

Figure 2:
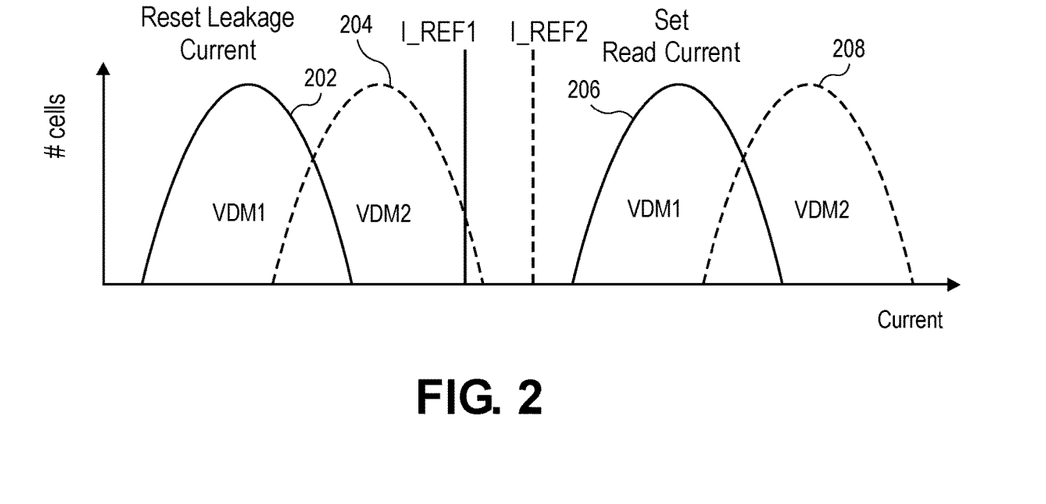
FIG. 2 illustrates an example of a VDM dependent current window and corresponding sense reference currents.

FIG. 2 illustrates an example of a VDM dependent current window and corresponding sense reference currents. Like in FIG. 1D, FIG. 2 illustrates current distributions for both reset and set cells in response to two demarcation voltages. However, unlike in FIG. 1D, FIG. 2 shows an example with two different reference currents that correspond to the two demarcation voltages. The first reference current I_REF1 is between the current distributions 202 and 206 for set and reset cells responsive to voltage VDM1. The second reference current is between current distributions 204 and 208 for set and reset cells responsive to voltage VDM2. Thus, different reference currents are used for read operations based on the demarcation voltages applied to perform the read operations.

In one example, the demarcation voltage is adjusted (e.g., increased) with time to account for effects such as threshold voltage drift. For example, at an initial time after manufacture, a first demarcation voltage VDM1 is used for read operations. A first reference current is used for read operations based on use of the first demarcation voltage. After some time has elapsed, a second demarcation voltage VDM2 is used. Once read operations start using the second demarcation voltage, a second reference current is used for the read operations. Although only two demarcation voltages and two reference currents are illustrated in FIG. 2, the technique can apply to more than two demarcation voltages and more than two reference currents (e.g., 3, 4, etc.). Additionally, although FIG. 2 shows an example in which the demarcation voltages and reference currents increase in magnitude, the same technique can apply to examples in which the demarcation voltage and reference current decrease in magnitude.

Figure 3:
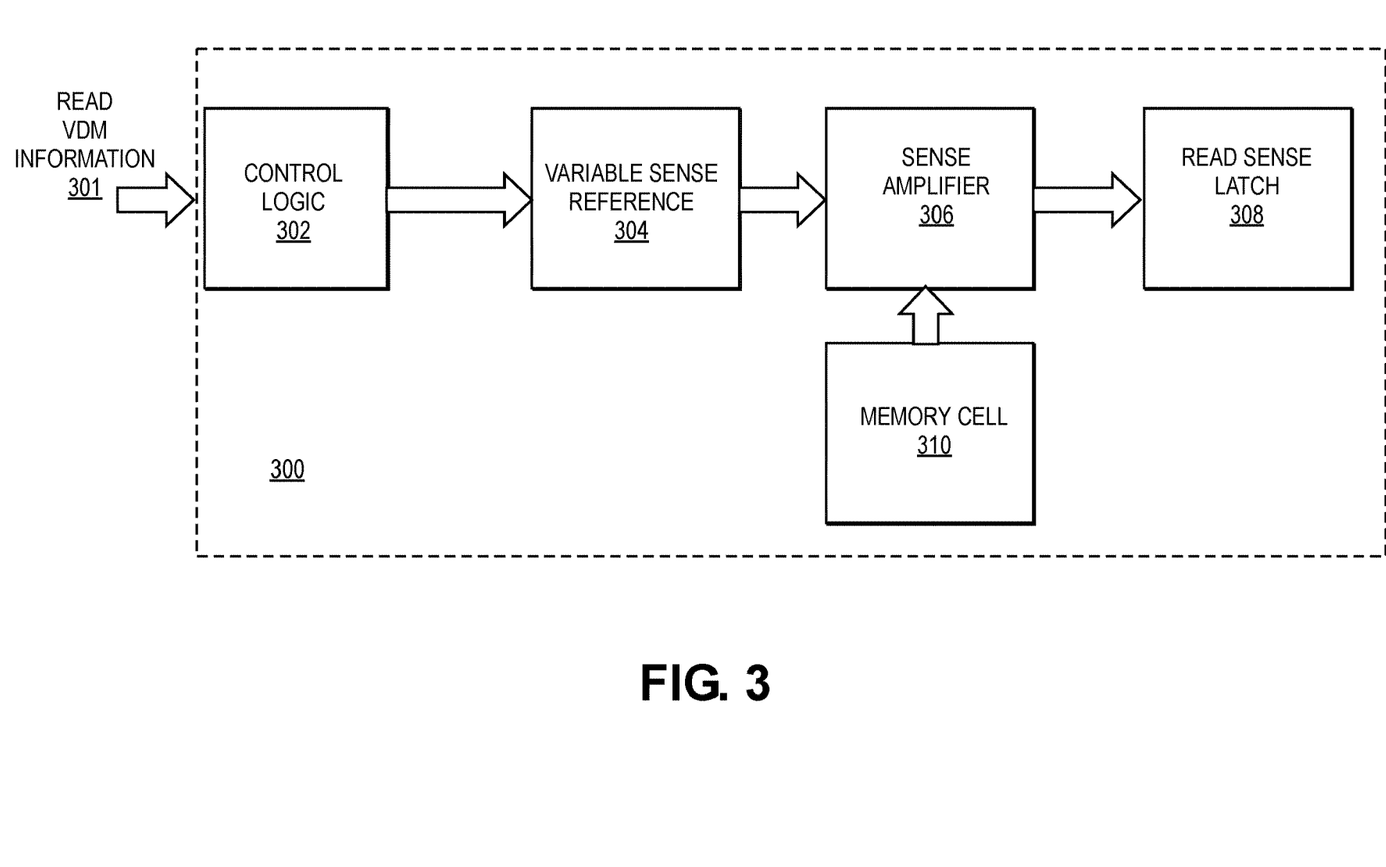
FIG. 3 illustrates a block diagram of an example of memory device logic to perform a variable reference based sensing scheme.

FIG. 3 illustrates a block diagram of an example of memory device logic to perform a variable reference based sensing scheme. In the example of FIG. 3, the logic 300 is on the memory die. The logic 300 may be the same as, similar to, or include the access logic 108 of FIG. 1A. The logic 300 receives signals from a controller, such as an ASIC memory controller coupled with the memory die. For example, a memory controller sends commands to the memory die to perform operations such as read or write operations. In the illustrated example, as part of a read operation, the controller provides read VDM information 301 to the logic 300 on the memory die. The read VDM information 301 includes a logic value to indicate which reference voltage to use for a read operation (e.g., VDM1, VDM2, VDM3, etc.).

The control logic 302 receives signals from the controller and performs various control related tasks, such as determining which operation to perform based on the received signals. The control logic 302 determines which read reference voltage to use based on the read VDM information 301 and sends a signal to the variable sense reference logic 304 to select the desired reference current. The selected demarcation voltage is applied across the memory cell 310 and the selected reference current is provided to sense circuitry (e.g., the sense amplifier 306). The sense amplifier 306 senses the current through the memory cell 310 and determines what state the memory cell 310 is in by comparing the sensed current with the selected reference current. The value stored by the memory cell 310 is then stored in the read sense latch 308. Thus, unlike in conventional memories in which the sense amplifier uses a fixed reference current to determine the state of the memory cell 310, the example in FIG. 3 selects the reference current based on the VDM information supplied by a controller. In other examples, the VDM information may be stored on the die instead of being provided by the controller.

In addition to sensing operations for read commands, a variable reference based sensing scheme can be used for other sensing operations as well. For example, write (or program) operations in some memories involve sensing operations.

Figure 4A:
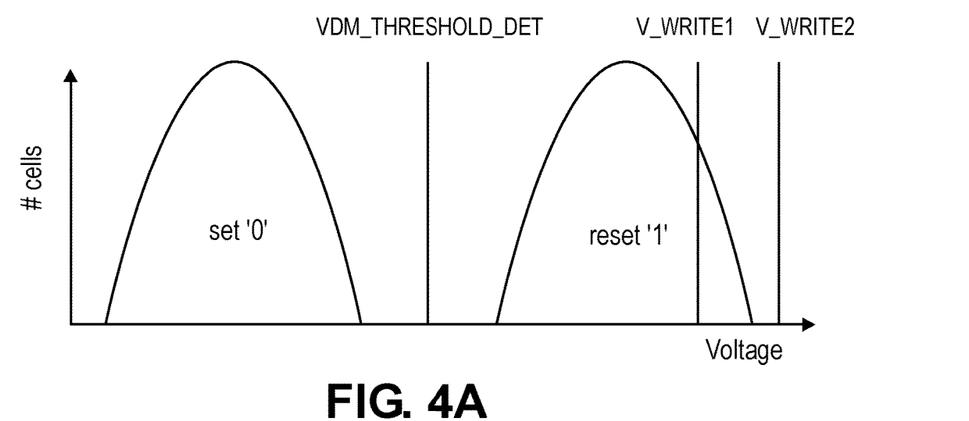
FIG. 4A illustrates an example of voltages used for a write algorithm.

Consider an example of a write algorithm that involves applying a write voltage across a memory cell followed by a sensing operation. For example, FIG. 4A illustrates an example of voltages used for a write algorithm. In this example, a first write voltage V_WRITE1 is applied across a memory cell. The first write voltage has a magnitude that is expected to cause most memory cells to threshold (e.g., memory cells having threshold voltages that are lower in magnitude than V_WRITE1), but not all. To determine whether the target memory cell thresholded in response to V_WRITE1, the algorithm involves performing a sensing operation to detect how much current is flowing through the memory cell. If the memory cell thresholded, it will have "snapped" into a higher conductive state, and therefore will conduct current that is above a threshold. If the memory cell did not threshold, the current through the cell will be less than the threshold. If the memory cell did not threshold, a larger magnitude write voltage is applied to the memory cell (V_WRITE2). Once the memory cell has thresholded, a current can be applied to the cell having a particular magnitude, duration, and polarity to program the memory cell to the desired value. One reason to perform a write algorithm involving a lower write voltage followed by a sensing operation is to reduce power consumption by avoiding the higher magnitude voltage in the majority of writes.

In one such example, in order to perform the sensing operation after application of the first write voltage, the voltage is transitioned to a lower magnitude voltage. As mentioned above, in some memories, the leakage current is related to the voltage across the cell. Therefore, a high magnitude voltage across the cell may result in a high leakage current. If the voltage across the cell is high enough, it may be difficult or impossible to distinguish between the leakage current and current conducted by a cell that has thresholded. In the example of FIG. 4A, the write voltage has a relatively large magnitude, and therefore the voltage is reduced for the sensing operation to a lower demarcation voltage (VDM_THRESHOLD_DET). The current through the memory cell in response to VDM_THRESHOLD_DET can then be compared to a reference current to determine whether the memory cell thresholded.

Figure 4B:
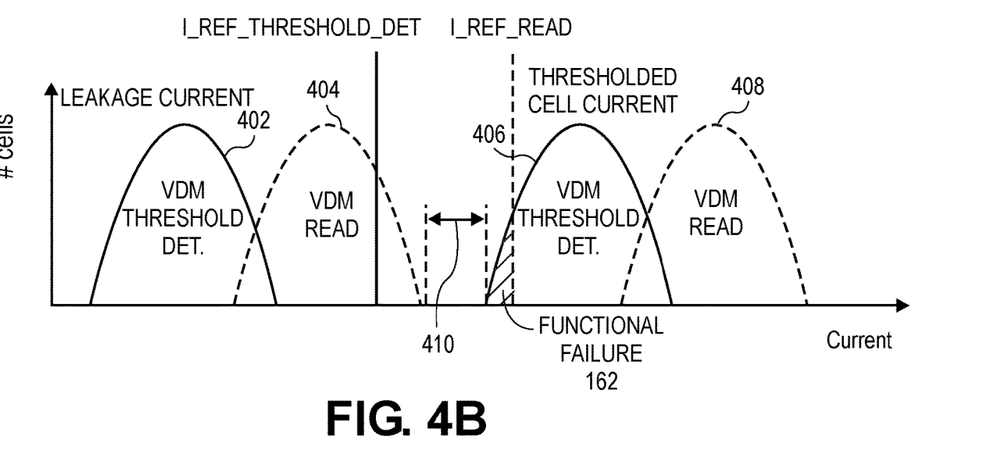
FIG. 4B illustrates an example of two different reference currents for read and write operations.

However, the reference current for the write (threshold or "snapback" detection) sensing operation may be independent and different than the reference current for the read operation. FIG. 4B shows an example of two different reference currents for read and write operations. The write sensing operation may use a different demarcation voltage than the read sensing operation. As a result, the current distributions exhibited by memory cells in response to the different demarcation voltages may be different. The current distributions 402 and 406 are in response to application of a demarcation voltage applied for a write sensing operation. The current distribution 402 represents leakage current through a memory cell that has not thresholded in response to a write voltage. The current distribution 406 represents the current through a memory cell that has thresholded in response to a write voltage. The current distributions 404 and 408 are in response to application of a demarcation voltage for a read sensing operation for reset and set cells, respectively.

In the example of FIG. 4B, the current distributions for the read sensing and write sensing operations are different. Therefore, using the same reference current for the sensing operations for read and write operations may result in errors. For example, if the reference current I_REF_READ is used in the threshold detection sensing operation as well as the read sensing operation, a functional failure 162 will occur for some cells. Failures can be avoided by using a different reference currents for the threshold detection sensing operations and read sensing operations. For example, FIG. 4B illustrates an example in which the reference current I_REF_THRESHOLD_DET is used for threshold detection operations, and a different reference current I_REF_READ is used for read sensing operations.

As discussed above, the demarcation voltage used for a read operations may change depending on, for example, time. The demarcation voltage used for write sensing operations can be static or change. If the write sensing demarcation voltage is static, then a static reference current may suffice for threshold detection sensing operations. However, if the demarcation voltage used for sensing during writes changes, the reference current may be based on the applied demarcation voltage. For example, at an initial time, a first demarcation voltage (VDM_THRESHOLD_DET1) may be used, and then at a later time a second demarcation voltage (VDM_THRESHOLD_DET2) may be used, and so on. In this example, a first reference current (e.g., I_REF_THRESHOLD_DET1) may be used based on the magnitude of VDM_THRESHOLD_DET1, and at the second time a second reference current (e.g., I_REF_THRESHOLD_DET2) may be used based on the magnitude of VDM_THRESHOLD_DET2. The variable reference based sensing schemes can be combined; for example, both the reference currents for threshold detection operations and read operations may be selected and based on the applied voltages.

Figure 5A:
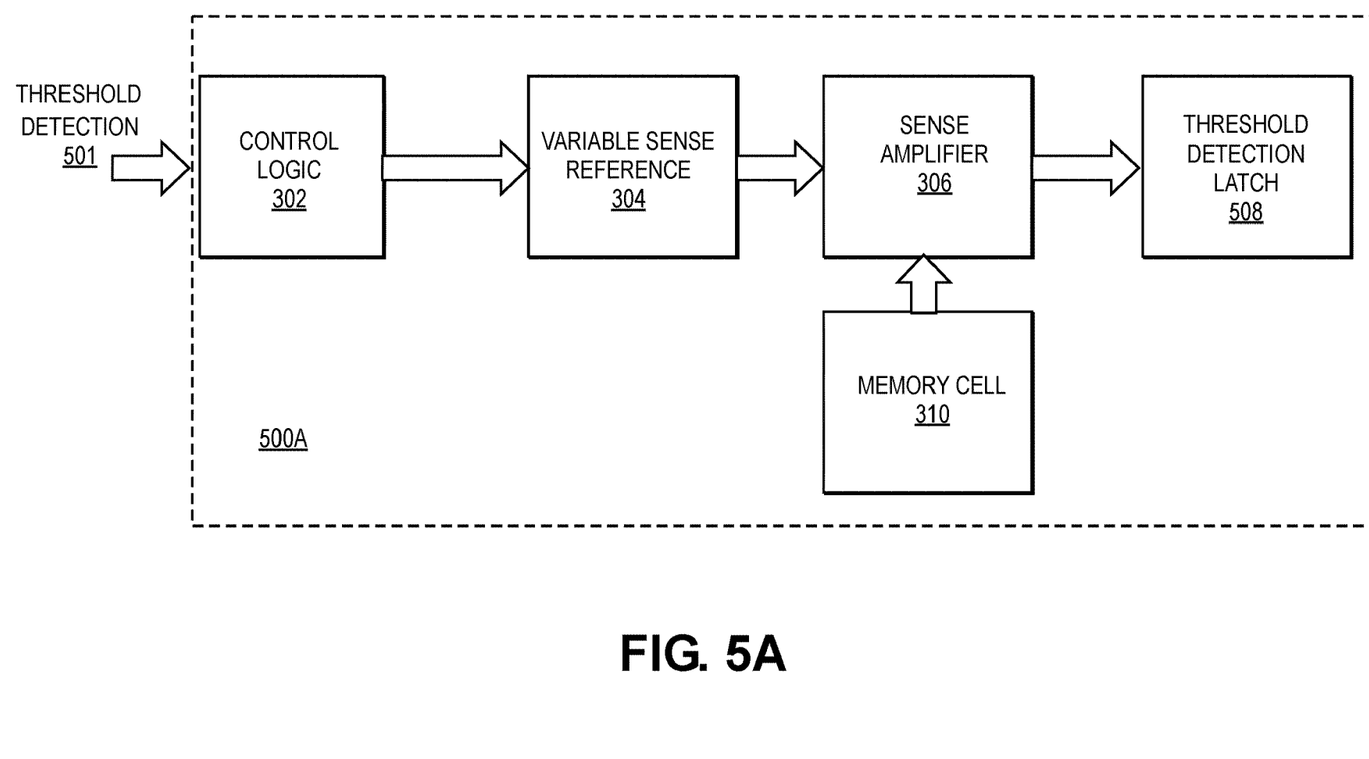
FIGS. 5A and 5B are block diagrams of examples of memory device logic to perform a variable reference based sensing scheme.
Figure 5B:
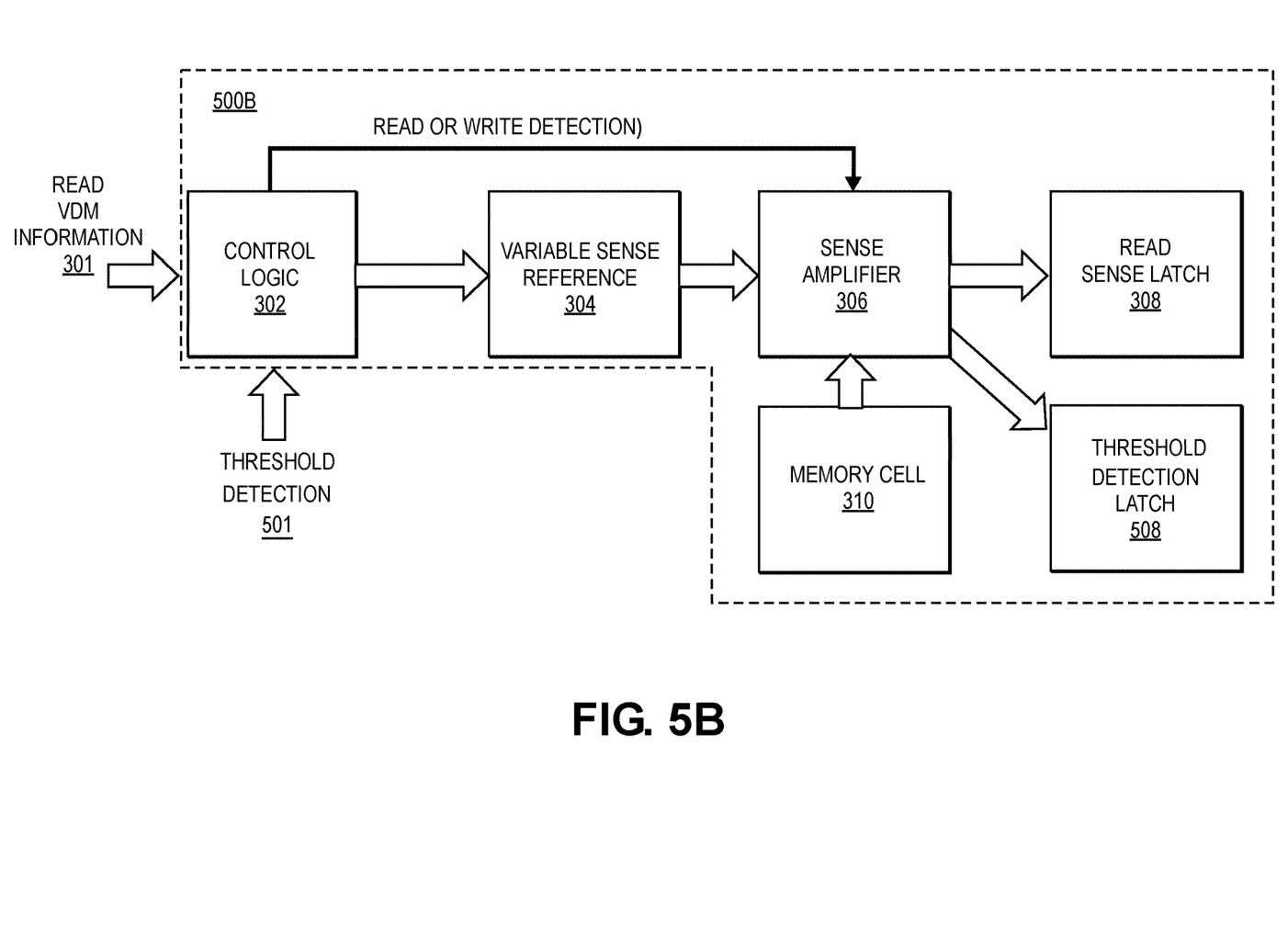

FIGS. 5A and 5B are block diagrams of examples of memory device logic to perform a variable reference based sensing scheme. FIGS. 5A and 5B are similar to FIG. 3 in that they include logic to perform variable reference based sensing, including control logic 302, variable sense reference logic 304, a memory cell 310, a sense amplifier 306, and latches to store the detected logic values.

FIG. 5A depicts logic 500A to enable selection of different reference currents for write threshold detection and read operations. For example, the control logic 302 receives a write threshold detection signal 501 from a controller (e.g., an ASIC controller external to the memory die) to indicate that a write command including a sensing operation is to be performed. The control logic 302 determines which voltage(s) to apply to perform the write and sensing operations. In one example, the demarcation voltage used for threshold detection is static (e.g., fused or hard-coded via another mechanism). The variable sense reference logic 304 receives a signal indicating the demarcation voltage for the sensing operation and provides the appropriate reference current based on the demarcation voltage to the sense amplifier 306. The selected demarcation voltage is applied across the memory cell 310 and the selected reference current is provided to the sense amplifier 306. The sense amplifier 306 senses the current through the memory cell 310 and determines whether the memory cell thresholded by comparing the sensed current with the selected reference current. The result of the threshold detection operation is then stored in the threshold detection latch 508.

FIG. 5B illustrates an example of logic to implement variable reference based sensing for both different read demarcation voltages and for threshold detection. The logic 500B is similar to the logic of FIGS. 3 and 5A. The control logic 302 receives both read VDM information 301 to indicate which demarcation is used for the read operation and write threshold detection 501 indicating that the sensing operation is for a write operation. The control logic determines the appropriate demarcation voltage to apply across the memory cell 310 based on whether a read or write operation is being performed and may further be based on demarcation voltage information (e.g., information 301) provided by the controller. The control logic also provides a signal to the sense amplifier indicating whether a read or write operation is being performed. Depending on which operation is being performed, the results of the sensing operation are stored in either the read sense latch 308 or the threshold detection latch 508.

Although the examples illustrated in FIGS. 5A and 5B assume a static demarcation voltage for threshold detection, the demarcation voltage for the write operation can be varied similarly to the read demarcation voltage. For example, the write demarcation voltage may be adjusted (e.g., over time) and the reference current for the write sensing operation can be based on the write demarcation voltage. Also, although the examples of FIGS. 3 and 5B describe a controller external to the memory die providing information indicating the selected read demarcation voltage, in other examples logic internal to the memory die determines the read demarcation voltage.

Figure 6:
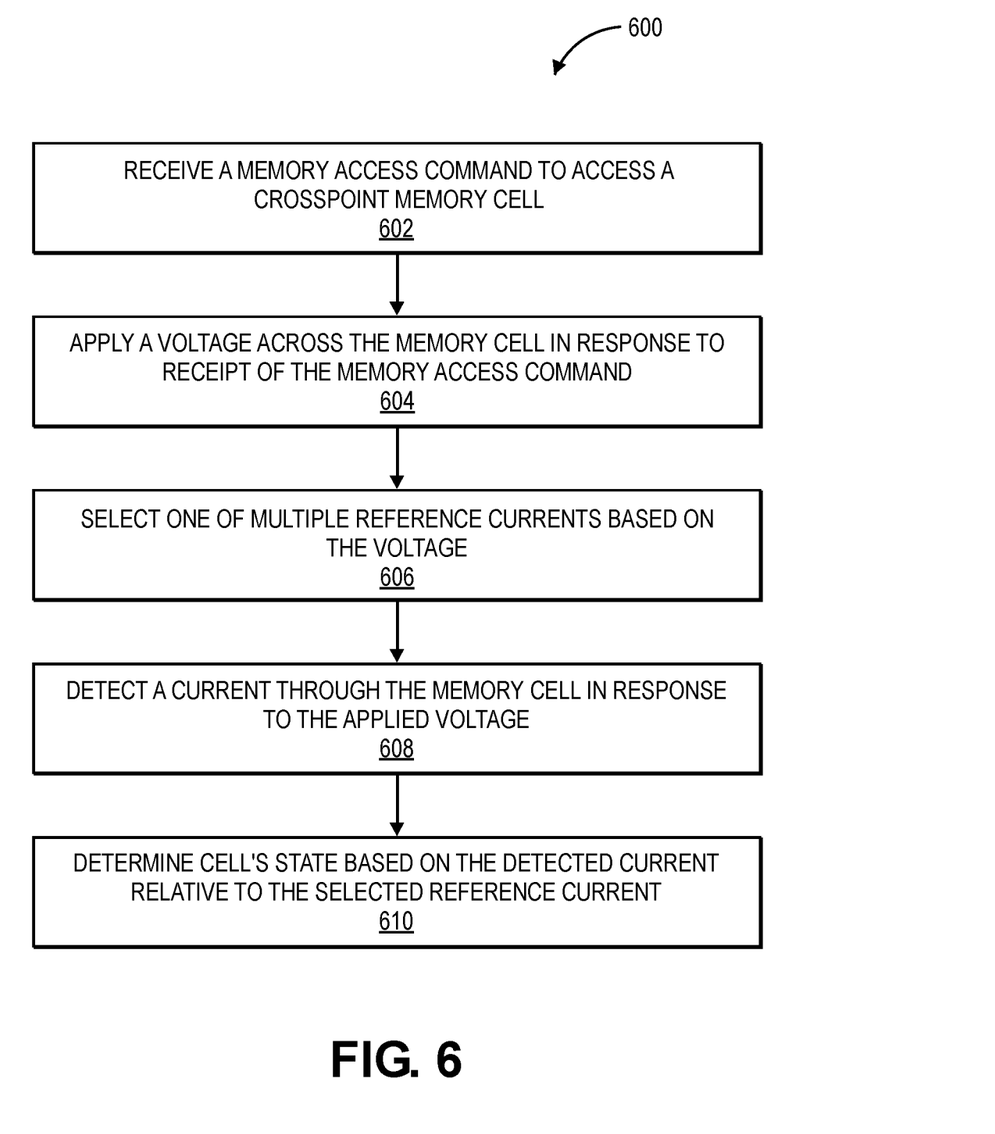
FIG. 6 is a flow diagram of an example of variable reference based sensing scheme.

FIG. 6 is a flow diagram of an example of variable reference based sensing scheme. The method 600 can be performed by hardware, firmware, or a combination of hardware and firmware.

The method 600 begins with receiving a memory access command to access a crosspoint memory cell, at 602. The memory access command can be, for example, a read command, a write command, or any other command or request to access a memory cell in which a sensing operation is performed. Performing the memory access command may involve multiple sub-operations, at least one of which is a sensing operation. In the illustrated example in FIG. 6, performance of the sensing operation involves applying a voltage across the memory cell in response to receipt of the memory access command, at 604. In one example, the voltage is selected from multiple demarcation voltages. The voltage can be a reference or demarcation voltage and may vary depending on whether the memory access command is a read or write command. The demarcation voltage may further depend on other factors such as elapsed time (e.g., elapsed time from some initial time). In one such example, control logic selects one of multiple demarcation voltages based on elapsed time. The demarcation voltage may be selected based on a signal from a controller, fuses, hard-coded, or from a register setting.

Based on the voltage, one of multiple reference currents is selected, at 606. In one example, control logic selects a reference current corresponding to the selected demarcation voltage. The selected reference current is one of multiple reference currents, each of which is between expected current distributions at the corresponding demarcation voltage. For example, referring to FIG. 2, if the memory access command is a read command and the voltage is VDM1, a corresponding reference current I_REF1 is selected. If the memory access command is a read command and the voltage is VDM2, a corresponding reference current I_REF2 is selected. If the memory access command is a write command, a different VDM_THRESHOLD_DET1 or VDM_THRESHOLD_DET2 may be selected. The current through the cell is then detected, at 608, and compared to the selected reference current. The cell's state can then be determined based on the detected current relative to the selected reference current, at 610. For example, for a read sensing operation, if the current is above the selected reference current, the memory cell is in one logic state, and if the current is below the selected reference current, the memory cell is in a second logic state. In another example, for a write sensing operation, if the current is below the selected reference current, the memory cell has not thresholded, and if the current is greater than the selected reference current, the memory cell has thresholded.

By selecting the reference current based on the voltage applied for the sensing operation, the correct state of the memory cells can be determined, reducing bit error rate, which in turn improves yield.

Figure 7:
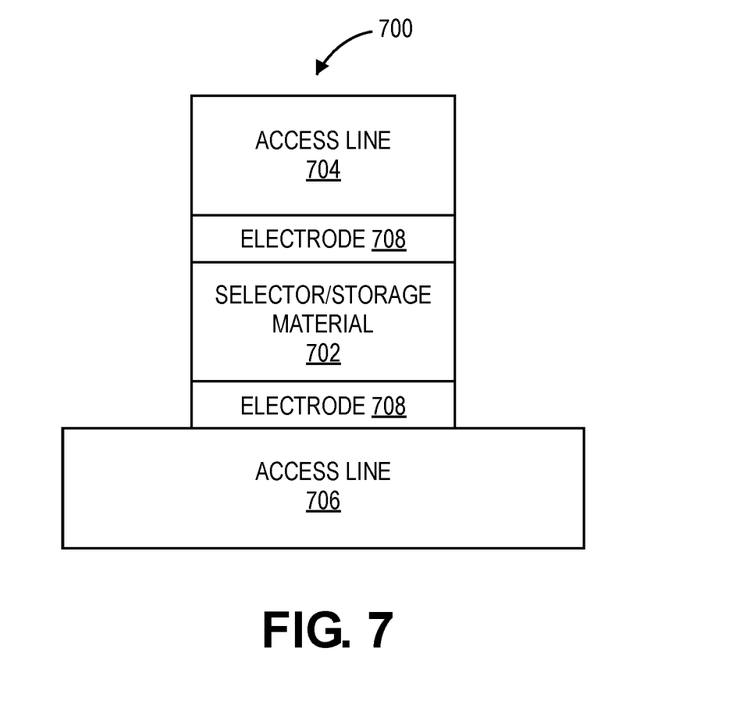
FIG. 7 illustrates an example of a crosspoint memory cell that can be accessed using techniques described herein.

FIG. 7 illustrates an example of a crosspoint memory cell that can be accessed using techniques described herein.

FIG. 7 illustrates a memory cell 700. The memory cell 700 includes one or more layers of material 702 to store data and aid in selection of the memory cell 100. For example, the memory cell 700 can include a storage material 702, a selector material, or both, between access lines 704 and 706. In one example, the memory cell includes a layer of storage material and a separate layer of selector material. In one example, the selector is a device with a threshold voltage and the storage element is a device with a tunable threshold voltage. In one example, the memory cell 700 includes a self-selecting material that exhibits both memory and selection effects. A self-selecting material is a storage material that enables selection of a memory cell in an array without requiring a separate layer of material for selection of the cell. In one example, a self-selecting memory cell includes a single layer of material that acts as both a selector element to select the memory cell and a memory element to store a logic state. A material exhibits memory effects if the material can be put in one of multiple stable states (e.g., via a write operation), and subsequently read back (e.g., via a read operation).

The techniques described herein apply generally to crosspoint memory, resistive memory, or current-based memory, and are not dependent on or specific to a particular storage material. However, some non-limiting examples of storage material follow.

In some examples, the storage material is a phase change material. In other examples, the storage material can be in one or multiple stable states without a change in phase. In one example, the memory element, switching element, or both are amorphous semiconductor threshold switches (e.g., ovonic threshold switches) using an amorphous material such as an amorphous chalcogenide material or other amorphous material. An ovonic threshold switch remains in an amorphous state which distinguishes it from an ovonic memory, which generally changes between amorphous and crystalline states. In one example, an ovonic memory is used in series with an ovonic threshold switch. In such case, the ovonic threshold switch operates as the select device for the ovonic memory. Whether the memory material of the memory cell changes phase or not, in one example, the memory could be referred to as a resistance-based memory. In a resistance-based memory, the bit stored by a memory cell is based on the resistive state of the memory cell.

Examples of storage material can include one or more of: tellurium (Te), selenium (Se), germanium (Ge), antimony (Sb), bismuth (Bi), lead (Pb), tin (Sn), indium (In), silver (Ag), arsenic (As), sulfur (S), phosphorus (P), molybdenum (Mo), gallium (Ga), aluminum (Al), oxygen (O), nitrogen (N), chromium (Cr), gold (Au), niobium (Nb), palladium (Pd), cobalt (Co), vanadium (V), nickel (Ni), platinum (Pt), titanium (Ti), tungsten (W), tantalum (Ta) or other materials. For example, the storage material may include one or more chalcogenide materials such as such as Te—Se, Ge—Te, In—Se, Sb—Te, Ge—Sb, Ta—Sb—Te, Ga—Sb, In—Sb, As—Te, As—Se, Al—Te, As—Se—Te, Ge—Sb—Te, Ge—As—Se, Te—Ge—As, V—Sb—Se, Nb—Sb—Se, In—Sb—Te, In—Se—Te, Te—Sn—Se, V—Sb—Te, Se—Te—Sn, Ge—Se—Ga, Mo—Sb—Se, Cr—Sb—Se, Ta—Sb—Se, Bi—Se—Sb, Mo—Sb—Te, Ge—Bi—Te, W—Sb—Se, Ga—Se—Te, Ge—Te—Se, Cr—Sb—Te, Sn—Sb—Te, W—Sb—Te, Sn—Sb—Bi, In—Sb—Ge, As—Sb—Te, Ge—Te—Ti, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Se—Te—In, As—Ge—Sb—Te, Se—As—Ge—In, Ge—Sb—Se—Te, Ge—Sn—Sb—Te, Ge—Te—Sn—Ni, Ge—Te—Sn—Pd, and Ge—Te—Sn—Pt, Si—Ge—As—Se, In—Sn—Sb—Te, Ge—Se—Te—Si, Si—Te—As—Ge, Ag—In—Sb—Te, Ge—Se—Te—In—Si, Se—As—Ge—Si—In, or other materials capable of being programmed to one of multiple states. One or more elements in a chalcogenide material may be dopants. For example, the storage material may include dopants such as: aluminum (Al), oxygen (O), nitrogen (N), silicon (Si), carbon (C), boron (B), zirconium (Zr), hafnium (Hf), or a combination thereof. The storage material may include other materials or dopants not explicitly listed.

As mentioned above, some memory cells include a separate layer of selector material to form a selector device. The selector material may include a chalcogenide material (e.g., a chalcogenide glass) or other material capable of operating as a selection element. In one example, the selector material includes one or more of: silicon (Si), germanium (Ge), selenium (Se), arsenic (As), tellurium (Te), or other materials. In one example, the selector material includes Si—Ge—As—Se, As—Ge—Te—Si, or other selector material. The selector material may also include dopants such as: aluminum (Al), oxygen (O), nitrogen (N), silicon (Si), carbon (C), boron (B), zirconium (Zr), hafnium (Hf), or a combination thereof. The selector material may include other materials or dopants not explicitly listed.

The access lines 704, 706 electrically couple the memory cell with circuitry that provides power to and enables access to the memory cell. The term "coupled" can refer to elements that are physically, electrically, and/or communicatively connected either directly or indirectly, and may be used interchangeably with the term "connected" herein. Physical coupling can include direct contact. Electrical coupling includes an interface or interconnection that allows electrical flow and/or signaling between components. Communicative coupling includes connections, including wired and wireless connections, that enable components to exchange data. The access lines 704, 706 can be referred to as a bit line and word line, respectively. The word line is for accessing a particular word in a memory array and the bit line is for accessing a particular bit in the word. The access lines 704, 706 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one example, electrodes 708 are disposed between storage material 702 and access lines 704, 706. Electrodes 708 electrically couple access lines 704, 706 with storage material 702. A memory cell with separate layers of storage and selector material may also include an electrode between the layers of storage and selector material. Electrodes 708 can be composed of one or more conductive and/or semiconductive materials such as, for example: carbon (C), carbon nitride ($C_xN_y$); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials.

Figure 8:
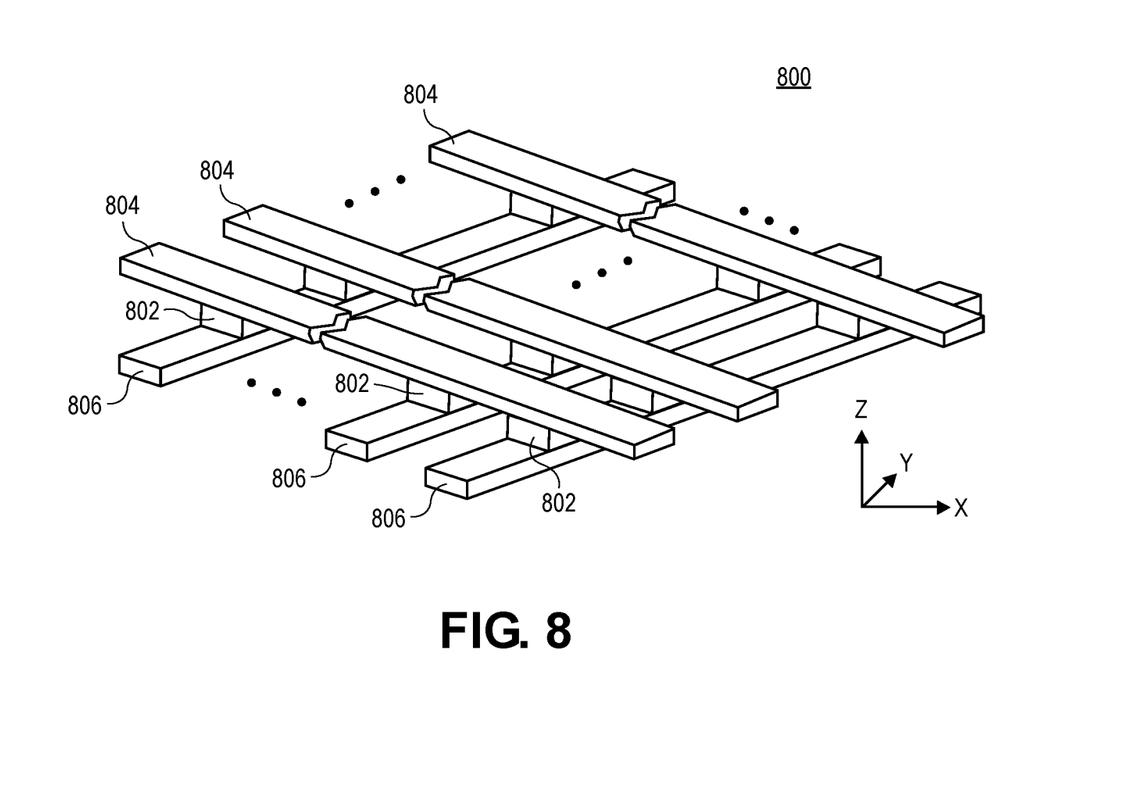
FIG. 8 illustrates a portion of a memory cell array.

FIG. 8 illustrates a portion of a crosspoint memory array 800, which can include a memory cell such as the memory cell 106 of FIG. 1 or memory cell 700 of FIG. 7. The memory cell array 800 is an example of a crosspoint memory array. The memory cell array 800 includes a plurality of access lines 804, 806, which can be the same or similar as the access lines 704, 706 described with respect to FIG. 7. Access lines 804, 806 can be referred to as bit lines and word lines. In the example illustrated in FIG. 8, the bit lines (e.g., access lines 804) are orthogonal to the word lines (e.g., access lines 806). A storage material 802 is disposed between the access lines 804, 806. In one example, a "crosspoint" is formed at an intersection between a bit line, a word line. A memory cell is created from the storage material 802 between the bit line and word line where the bit line and word line intersect. The storage material 802 can be a chalcogenide material, phase change material, both a chalcogenide material and phase change material, or other storage material. In one example, the access lines 804, 806 are composed of one or more conductive materials such as the access lines 704, 706 described above with respect to FIG. 7.

Although a single level or tier of memory cells is shown in FIG. 8 for the sake of clarity, memory cell array 800 typically includes multiple levels or tiers of non-volatile memory cells (e.g., in the z-direction). Nonvolatile memory devices including multiple tiers of crosspoint memory cells may be referred to as three-dimensional (3D), multi-level, or multi-tiered crosspoint memory devices. The FIGS. 7 and 8 illustrate an example of a memory cell and array in which the variable reference based sensing techniques described herein may be implemented. However, the techniques described herein can be implemented in memory cell structures and arrays having different materials or structures than the examples described in FIGS. 7 and 8.

Figure 9:
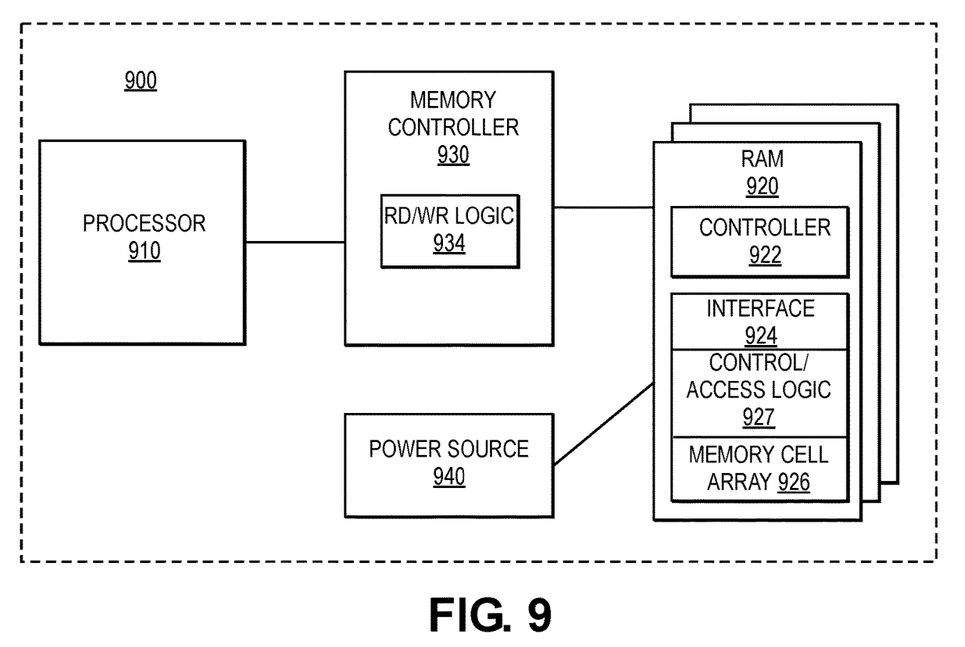
FIG. 9 is a block diagram of a system that can include a non-volatile memory device in accordance with examples described herein.

FIG. 9 is a block diagram of a system that can include a non-volatile memory device in accordance with examples described herein.

System 900 includes components of a memory subsystem having random access memory (RAM) 920 to store and provide data in response to operations of processor 910. The system 900 receives memory access requests from a host or a processor 910, which is processing logic that executes operations based on data stored in RAM 920 or generates data to store in RAM 920. The processor 910 can be or include a host processor, central processing unit (CPU), microcontroller or microprocessor, graphics processor, peripheral processor, application specific processor, or other processor, and can be single core or multicore.

The system 900 includes a memory controller (e.g., host memory controller) 930, which represents logic to interface with RAM 920 and manage access to data stored in the memory. In one example, the memory controller 930 is integrated into the hardware of processor 910. In one example, the memory controller 930 is standalone hardware, separate from the processor 910. The memory controller 930 can be a separate circuit on a substrate that includes the processor. The memory controller 930 can be a separate die or chip integrated on a common substrate with a processor die (e.g., as a system on a chip (SoC)). In one example, the memory controller 930 is an integrated memory controller (iMC) integrated as a circuit on the processor die. In one example, at least some of RAM 920 can be included on an SoC with the memory controller 930 and/or the processor 910.

In the illustrated example, the memory controller 930 includes read/write logic 934, which includes hardware to interface with the RAM 920. The logic 934 enables the memory controller 930 to generate read and write commands to service requests for data access generated by the execution of instructions by processor 910.

The memory resources or cachelines in the RAM 920 are represented by a memory cell array 926, which can include a crosspoint array. The RAM 920 includes internal logic 927 to enable control and access of the memory cell array 926 in response to commands received from the controller 922 via an interface 924 (e.g., interface logic). In one example, the memory array 926 and the controller 922 are in the same package. The interface 924 and/or logic 927 can include decode logic, including logic to address specific rows or columns, bit lines or word lines, or otherwise address specific bits of data. The controller 922 can be an on-die controller or off-die controller (e.g., ASIC) on the RAM 920 to control its internal operations to execute commands received from memory controller 930. A power source 940 is connected to the RAM 920 to provide one or more voltage rails for operation of the RAM 920.

Figure 10:
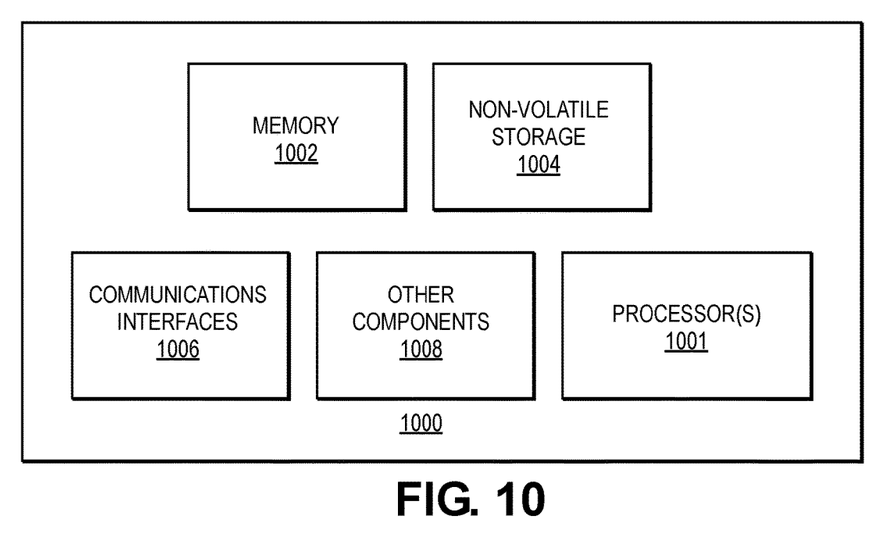
FIG. 10 provides an exemplary depiction of a computing system.

FIG. 10 provides an exemplary depiction of a computing system 1000 (e.g., a smartphone, a tablet computer, a laptop computer, a desktop computer, a server computer, etc.). As observed in FIG. 10, the system 1000 may include one or more processors or processing units 1001. The processor(s) 1001 may include one or more central processing units (CPUs), each of which may include, e.g., a plurality of general-purpose processing cores. The processor(s) 1001 may also or alternatively include one or more graphics processing units (GPUs) or other processing units. The processor(s) 1001 may include memory management logic (e.g., a memory controller) and I/O control logic. The processor(s) 1001 can be similar to, or the same as, the processor 910 of FIG. 9.

The system 1000 also includes memory 1002 (e.g., system memory), non-volatile storage 1004, communications interfaces 1006, and other components 1008. The other components may include, for example, a display (e.g., touchscreen, flat-panel), a power supply (e.g., a battery or/or other power supply), sensors, power management logic, or other components. The communications interfaces 1006 may include logic and/or features to support a communication interface. For these examples, communications interface 1006 may include one or more communication interfaces that operate according to various communication protocols or standards to communicate over direct or network communication links or channels. Direct communications may occur via use of communication protocols or standards described in one or more industry standards (including progenies and variants) such as those associated with the PCIe specification. Network communications may occur via use of communication protocols or standards such those described in one or more Ethernet standards promulgated by IEEE. For example, one such Ethernet standard may include IEEE 802.3. Network communication may also occur according to one or more OpenFlow specifications such as the OpenFlow Switch Specification. Other examples of communications interfaces include, for example, a local wired point-to-point link (e.g., USB) interface, a wireless local area network (e.g., WiFi) interface, a wireless point-to-point link (e.g., Bluetooth) interface, a Global Positioning System interface, and/or other interfaces.

The computing system also includes non-volatile storage 1004, which may be the mass storage component of the system. The non-volatile storage 1004 can be similar to, or the same as, the RAM 920 of FIG. 9, described above. Non-volatile storage 1004 may include byte or block addressable types of non-volatile memory having a crosspoint memory structure. Non-volatile types of memory may also include other types of byte or block addressable non-volatile memory such as, but not limited to, multi-threshold level NAND flash memory (e.g., 3D NAND flash memory), NOR flash memory, single or multi-level phase change memory (PCM), resistive memory, nanowire memory, ferroelectric transistor random access memory (FeTRAM), magnetoresistive random access memory (MRAM) that incorporates memristor technology, spin transfer torque MRAM (STT-MRAM), or a combination of any of the above. In one example, the non-volatile storage 1004 may include mass storage that is composed of one or more SSDs (solid state drives), DIMMs (dual in line memory modules), or other module or drive. The non-volatile storage 1004 or memory 1002 may include logic to implement the variable reference based sensing techniques described herein.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device comprising:
   a crosspoint memory array; and
   input/output (I/O) circuitry to receive a memory access command to access a memory cell of the crosspoint memory array;
   control logic to:
   determine a voltage to apply across the memory cell in response to receipt of the memory access command, and
   select one of multiple reference currents based on the voltage; and sense circuitry to:
   detect a current through the memory cell in response to the applied voltage, and
   determine a state of the memory cell based on the detected current relative to the selected reference current.

2. The memory device of claim 1, wherein the control logic is to:
   select the voltage from multiple demarcation voltages, wherein each of the multiple reference currents corresponds to one of the multiple demarcation voltages.

3. The memory device of claim 2, wherein the control logic to select one of the multiple demarcation voltages is to:
   select one of the multiple demarcation voltages based on elapsed time.

4. The memory device of claim 2, wherein the control logic to select one of the multiple reference currents is to:
   select a reference current corresponding to the selected demarcation voltage.

5. The memory device of claim 4, wherein:
   each of the multiple reference currents is between expected current distributions at the corresponding demarcation voltage.

6. The memory device of claim 1, wherein:
   the memory access command includes a memory read command.

7. The memory device of claim 1, wherein:
   the memory access command includes a memory write command, wherein performance of the memory write command includes: application of one or more voltages across the crosspoint memory cell and detection of the current through the memory cell.

8. A system comprising:
   a memory controller; and
   a memory die in a same package as the memory controller, the memory die comprising:
   a crosspoint memory array; and
   input/output (I/O) circuitry to receive a memory access command from the memory controller to access a memory cell of the crosspoint memory array;
   control logic to:
   determine a voltage to apply across the memory cell in response to receipt of the memory access command, and
   select one of multiple reference currents based on the voltage; and
   sense circuitry to:
   detect a current through the memory cell in response to the applied voltage, and
   determine a state of the memory cell based on the detected current relative to the selected reference current.

9. The system of claim 8, wherein the control logic is to:
select the voltage from multiple demarcation voltages, wherein each of the multiple reference currents corresponds to one of the multiple demarcation voltages.

10. The system of claim 9, wherein the control logic to select one of the multiple demarcation voltages is to:
select one of the multiple demarcation voltages based on elapsed time.

11. The system of claim 9, wherein the control logic to select one of the multiple reference currents is to:
select a reference current corresponding to the selected demarcation voltage.

12. The system of claim 11, wherein:
each of the multiple reference currents is between expected current distributions at the corresponding demarcation voltage.

13. The system of claim 8, wherein:
the memory access command includes a memory read command.

14. The system of claim 8, wherein:
the memory access command includes a memory write command, wherein performance of the memory write command includes: application of one or more voltages across the crosspoint memory cell and detection of the current through the memory cell.

15. The system of claim 8, further comprising:
one or more of: a processor, a host memory controller, and a power source.

16. A method comprising:
receiving a memory access command to access a crosspoint memory cell;
applying a voltage across the crosspoint memory cell in response to receipt of the memory access command;
selecting one of multiple reference currents based on the voltage;
detecting a current through the memory cell in response to the applied voltage; and
determining a state of the memory cell based on the detected current relative to the selected reference current.

17. The method of claim 16, wherein:
the voltage is selected from multiple demarcation voltages; and
each of the multiple reference currents corresponds to one of the multiple demarcation voltages.

18. The method of claim 17, further comprising:
selecting one of the multiple demarcation voltages based on elapsed time; and
wherein selecting one of the multiple reference currents comprises: selecting a reference current corresponding to the selected demarcation voltage.

19. The method of claim 16, wherein:
each of the multiple reference currents is between expected current distributions at the corresponding demarcation voltage.

20. The method of claim 16, wherein:
the memory access command includes a memory read command.

* * * * *